(12) United States Patent
Hsu et al.

(10) Patent No.: US 8,436,361 B2
(45) Date of Patent: May 7, 2013

(54) SCHOTTKY DIODE STRUCTURE AND METHOD FOR FABRICATING THE SAME

(75) Inventors: Shuo-Hung Hsu, Hsinchu (TW); Yi-Wei Lian, Hsinchu (TW); Yu-Syuan Lin, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 338 days.

(21) Appl. No.: 12/816,765

(22) Filed: Jun. 16, 2010

(65) Prior Publication Data

US 2011/0309371 A1    Dec. 22, 2011

(51) Int. Cl.
*H01L 31/0256* (2006.01)

(52) U.S. Cl.
USPC .......................................... 257/76; 438/478

(58) Field of Classification Search .............. 257/76, 257/E29.089, E29.338, E21.359; 438/478
See application file for complete search history.

(56) References Cited

U.S. PATENT DOCUMENTS

| | | | |
|---|---|---|---|
| 3,717,798 A * | 2/1973 | Kahn | 257/769 |
| 7,332,770 B2 * | 2/2008 | Kobayashi | 257/328 |
| 2005/0121691 A1 * | 6/2005 | Morand | 257/107 |
| 2007/0075392 A1 * | 4/2007 | Pan et al. | 257/483 |

* cited by examiner

*Primary Examiner* — Julio J Maldonado
*Assistant Examiner* — Robert Bachner
(74) *Attorney, Agent, or Firm* — Muncy, Geissler, Olds & Lowe, PLLC

(57) ABSTRACT

A Schottky diode structure and a method for fabricating the same, which are based on the principle of charge compensation, wherein a P-type gallium nitride layer is added to a Schottky diode structure, and wherein the PN junction of the P-type gallium nitride layer and the N-type gallium nitride layer decreases the non-uniformity of the surface electric field distribution, whereby the breakdown voltage of the element is raised.

15 Claims, 5 Drawing Sheets

SCHOTTKY DIODE STRUCTURE AND METHOD FOR FABRICATING THE SAME

FIELD OF THE INVENTION

The present invention relates to a Schottky diode structure and a method for fabricating the same, particularly to a gallium nitride-based Schottky diode structure having a high-breakdown voltage and a method for fabricating the same.

BACKGROUND OF THE INVENTION

The Schottky diode is a power rectifier widely applied to many fields, such as power supply devices, power converters, motor controllers, telecommunication switches, factory automation apparatuses, electronic automation devices and low-voltage converters. The Schottky diode is indeed superior in switching speed. However, the Schottky diode still needs careful design in the materials and structures to achieve a low reverse leakage current, a high breakdown voltage and a low turn-on voltage so as to achieve the best performance.

In comparison with the silicon-based Schottky diode, the gallium nitride Schottky diode has a wider energy gap and a better carrier conduction performance. Therefore, the gallium nitride-based Schottky diode has a higher breakdown field and a lower on-state resistance. The gallium nitride-based Schottky diode further has a high switching speed and a low switching loss. Therefore, the gallium nitride-based Schottky diode plays an important role in application of rectifiers. Refer to FIG. 1. The conventional gallium nitride-based Schottky diode 1 comprises a substrate 2, a buffer layer 3, an N-type gallium nitride layer 4, an ohmic contact electrode 5, a Schottky electrode 6, and a protection layer 7, wherein a Schottky contact is formed between the Schottky electrode 6 and the N-type gallium nitride layer 4, and the buffer layer 3 makes the N-type gallium nitride layer 4 easily formed on the substrate 2.

The substrate of the gallium nitride-based Schottky diode is usually made of sapphire or silicon carbide. However, the poor heat conduction between sapphire and gallium nitride is unfavorable for use in high power application. Further, the silicon carbide substrate is expensive and has limited commercial application. Therefore, the silicon substrate, which is less expensive and has an appropriate thermal conductivity, has been gradually adopted recently.

Under a reverse bias, the electric field strength has a peak in the interface between the Schottky electrode and the N-type gallium nitride layer and gradually decreases from the interface toward the substrate and the ohmic contact electrode. When the peak strength is greater than the breakdown voltage of the N-type gallium nitride layer, or when the electric field strength in the substrate is greater than the breakdown voltage of the substrate, the Schottky diode breaks down.

The breakdown voltage of silicon (about 0.3 MV/cm) is lower than one tenth of the breakdown voltage of gallium nitride (about 3.3 MV/cm). Therefore, too thin an N-type gallium nitride layer is likely to cause the breakdown of the silicon substrate and results in a relatively lower breakdown voltage of the entire Schottky diode. When the gallium nitride layer has a thickness of 1-2 μm, the diode has a breakdown voltage of 100-300V. When the gallium nitride layer has a thickness of 5-6 μm, the diode has a breakdown voltage as high as 650V. However, a thicker gallium nitride layer is expensive. Further, the lattice mismatch between gallium nitride and silicon is very great and likely to generate crystal dislocation and result in poor reliability.

SUMMARY OF THE INVENTION

The primary objective of the present invention is to provide a Schottky diode structure and a method for fabricating the same, which can increase the breakdown voltage of the Schottky diode and decrease the non-uniform distribution of the electric field to prevent from the breakdown of the substrate and the gallium nitride layer of the Schottky diode.

To achieve the abovementioned objective, the present invention proposes a Schottky diode structure, which comprises a substrate, a P-type gallium nitride layer formed on the substrate, an N-type gallium nitride layer formed on the P-type gallium nitride layer and a Schottky electrode formed on the N-type gallium nitride layer. The PN junction formed from the P-type gallium nitride layer and the N-type gallium nitride layer can efficiently lower the surface electric field of the Schottky diode and smooth the distribution thereof under a reverse bias, whereby is increased the breakdown voltage of the entire Schottky diode.

In one embodiment, the charges of the P-type gallium nitride layer and the N-type gallium nitride layer are in equilibrium, whereby is achieved a higher breakdown voltage.

The present invention also proposes a method for fabricating the abovementioned Schottky diode structure, which comprises steps: preparing a substrate; forming a P-type gallium nitride layer on the substrate; forming an N-type gallium nitride layer on the P-type gallium nitride layer; and forming a Schottky electrode and an ohmic contact electrode on the N-type gallium nitride.

Below, the embodiments are described in detail to further demonstrate the characteristic and advantages of the present invention.

BRIEF DESCRIPTION OF THE DRAWINGS

The embodiments of the present invention are described in cooperation with the following drawings.

DETAILED DESCRIPTION OF THE PREFERRED EMBODIMENTS

The technical contents of the present invention are described in detail in cooperation with the drawings below.

Figure 2:
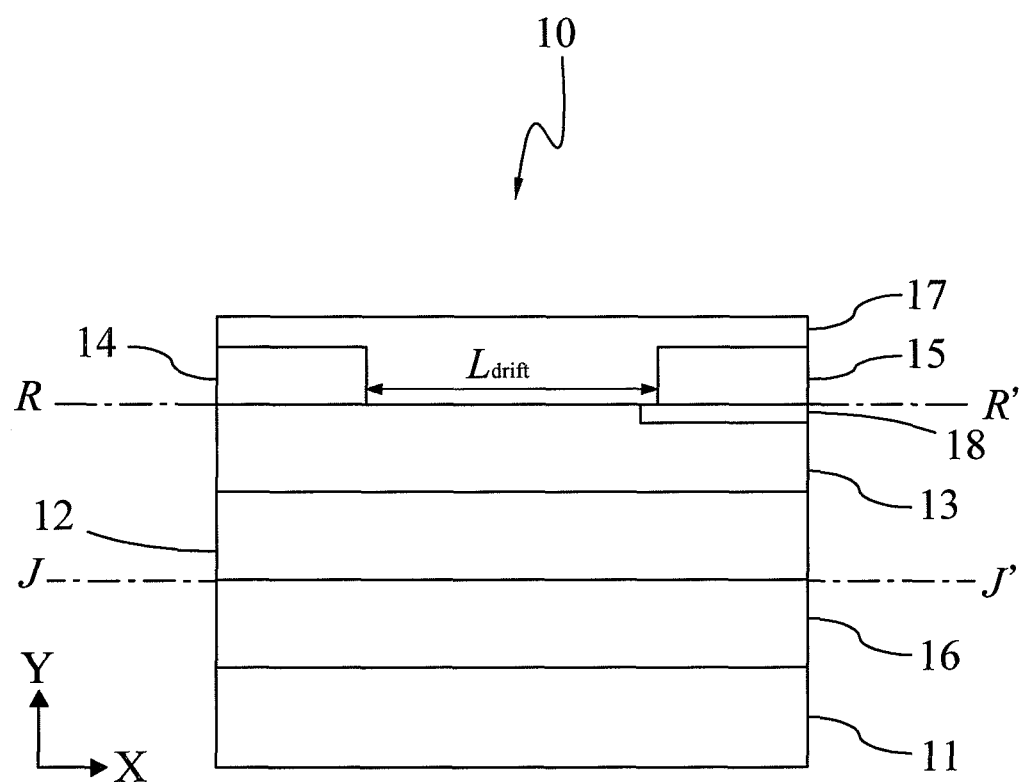
FIG. 2 is a diagram schematically showing a Schottky diode structure according to one embodiment of the present invention.

Refer to FIG. 2 a diagram schematically showing a Schottky diode structure according to one embodiment of the present invention. The Schottky diode structure 10 of the present invention comprises a substrate 11, a P-type gallium nitride layer 12 formed on the substrate 11, an N-type gallium nitride layer 13 formed on the P-type gallium nitride layer 12, a Schottky electrode 14 and an ohmic contact electrode 15 both formed on the N-type gallium nitride layer 13.

The substrate 11 is made of an appropriate material. The material of the substrate 11 may be but is not limited to a material selected from a group consisting of sapphire ($Al_2O_3$), silicon carbide (SiC), silicon (Si), spinel, diamond, diamond like carbon (DLC), aluminum nitride (AlN), lanthanum gallate ($LiGaO_3$), lanthanum aluminate ($LiAlO_3$), zinc oxide (ZnO), gallium nitride (GaN), gallium phosphide (GaP), gallium arsenide (GaAs), zinc selenide (ZnSe), and indium phosphide (InP).

The P-type gallium nitride layer 12 and the N-type gallium nitride layer 13 are respectively formed on the substrate 11. The present invention does not particularly limit the thickness or the carrier concentration of the P-type gallium nitride layer 12 or the N-type gallium nitride layer 13. Determining the thickness or the carrier concentration is a trade-off consideration. When the dopant concentration increases, the Schottky diode can provide a greater on-state current. When the dopant concentration decreases, the Schottky diode has a higher breakdown voltage. When the gallium nitride layer has a greater thickness, it needs a longer time for crystal growth, which means that the gallium nitride layer has a lower fabrication efficiency but has a higher concentration of the on-state current. When the gallium nitride layer has a smaller thickness, it requires a shorter time for crystal growth, which means that the gallium nitride layer has a higher fabrication efficiency and a lower concentration of the on-state current. The charges of the P-type gallium nitride layer 12 and the N-type gallium nitride layer 13 are preferred to but not limited to be in equilibrium. It should be particularly explained that the abovementioned "equilibrium" does not mean the equality of the carrier concentrations and the thicknesses of the P-type gallium nitride layer 12 and the N-type gallium nitride layer 13, but means that the numbers of the total numbers of electrons and holes of the P-type gallium nitride layer 12 and the N-type gallium nitride layer 13 approach equilibrium. Thus, the Schottky diode can have a higher breakdown voltage.

In one embodiment, either of the P-type gallium nitride layer 12 and the N-type gallium nitride layer 13 has a carrier concentration of $10^{15}$-$10^{18}$ $cm^{-3}$. In one embodiment, the P-type gallium nitride layer 12 and the N-type gallium nitride layer 13 substantially have an identical thickness and an identical carrier concentration.

In one embodiment, a buffer layer 16 is formed on the substrate 11 before the P-type gallium nitride layer 12 is formed over the substrate 11. The buffer layer 16 may be a single-layer structure or a multi-layer structure. The buffer layer 16 can increase the stability of the structure of the P-type gallium nitride layer 12 formed over the substrate 11 via decreasing the lattice mismatch, defects and stress generated between the substrate 11 and the P-type gallium nitride layer 12, and thus can enhance the crystallization quality. The material of the buffer layer 16 may be but is not limited to a material selected from a group consisting of silicon nitride ($Si_3N_4$), aluminum nitride (AlN), high temperature aluminum nitride (HT-AlN), aluminum gallium nitride (AlGaN), indium gallium nitride (InGaN), silicon carbon nitride (SiCN), low temperature gallium nitride (LT-GaN), and un-doped gallium nitride (un-doped GaN).

Next, a Schottky electrode 14 and an ohmic contact electrode 15 are formed on the N-type gallium nitride layer 13 respectively. A Schottky contact is formed between the Schottky electrode 14 and the N-type gallium nitride layer 13. An ohmic contact is formed between the ohmic contact electrode 15 and the N-type gallium nitride layer 13. A protection layer 17 covers the N-type gallium nitride layer 13, the Schottky electrode 14 and the ohmic contact electrode 15. The protection layer 17 is made of an insulating material, such as silicon dioxide ($SiO_2$) or silicon nitride ($Si_3N_4$).

In one embodiment, either of the Schottky electrode 14 and the ohmic contact electrode 15 is made of an electrode material usually used in the field. The material of the Schottky electrode 14 and the ohmic contact electrode 15 may be but is not limited to a material selected from a group consisting of indium (In), tin (Sn), zinc (Zn), nickel (Ni), gold (Au), chromium (Cr), cobalt (Co), cadmium (Cd), aluminum (Al), vanadium (V), silver (Ag), titanium (Ti), tungsten (W), platinum (Pt), palladium (Pd), rhodium (Rh), ruthenium (Ru), a binary alloy of the metals mentioned above, and an alloy containing over two of the metals mentioned above.

In one embodiment, an $N^+$-type gallium nitride layer 18 is formed between the ohmic contact electrode 15 and the N-type gallium nitride layer 13 to decrease the on-state resistance of the ohmic contact electrode 15, increase the on-state current and thus form a better ohmic contact. The $N^+$-type gallium nitride layer 18 further functions as a field stop layer to prevent from the punch-through breakdown. In one embodiment, the $N^+$-type gallium nitride layer 18 has a dopant concentration over $10^{18}$ $cm^{-3}$.

In comparison with the conventional gallium nitride Schottky diode, the Schottky diode of the present invention is based on the principle of charge compensation, wherein the P-type gallium nitride layer 12 is additionally formed below the N-type gallium nitride layer 13. The PN junction of the P-type gallium nitride layer 12 and the N-type gallium nitride layer 13 makes the electric field uniformly distribute along a vertical direction of the stacking structure (the Y direction) or a horizontal direction of the stacking structure (the X direction).

Figure 1:
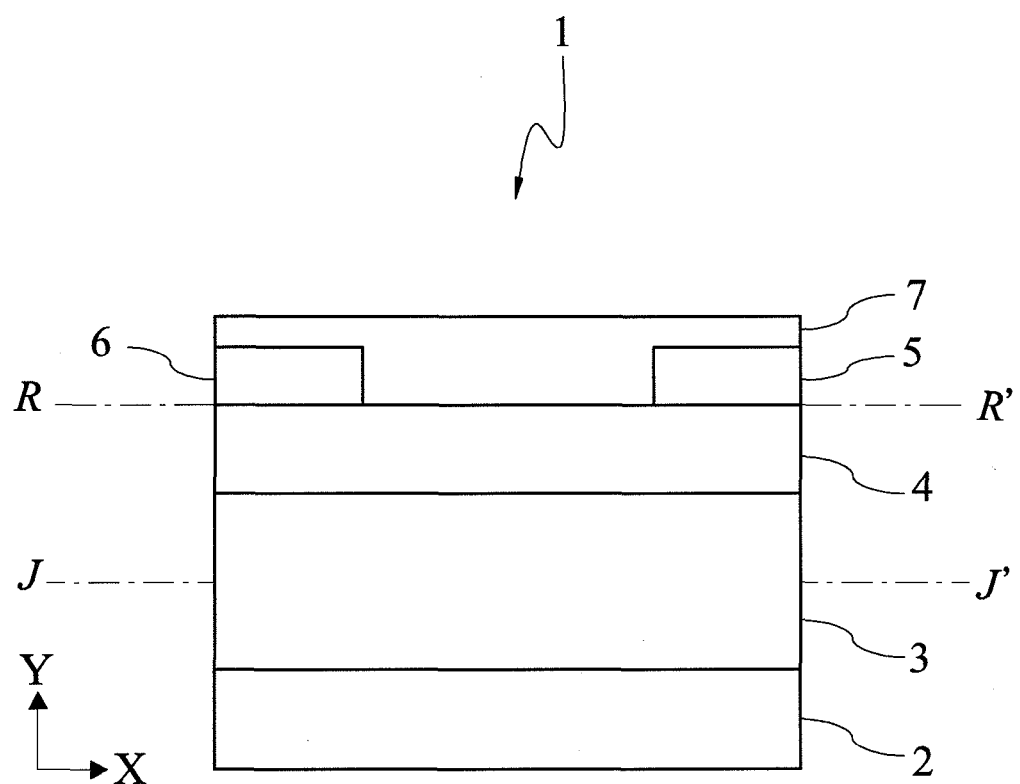
FIG. 1 is a diagram schematically showing a conventional Schottky diode structure.
Figure 3A:
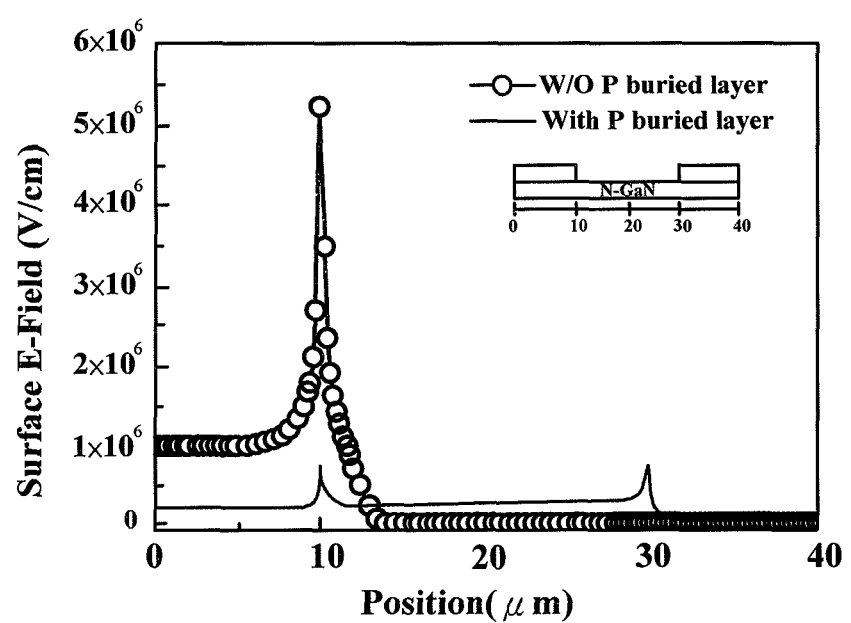
FIG. 3A and FIG. 3B are diagrams showing the distributions of the surface electric fields of a conventional Schottky diode and a Schottky diode according to the present invention.
Figure 3B:
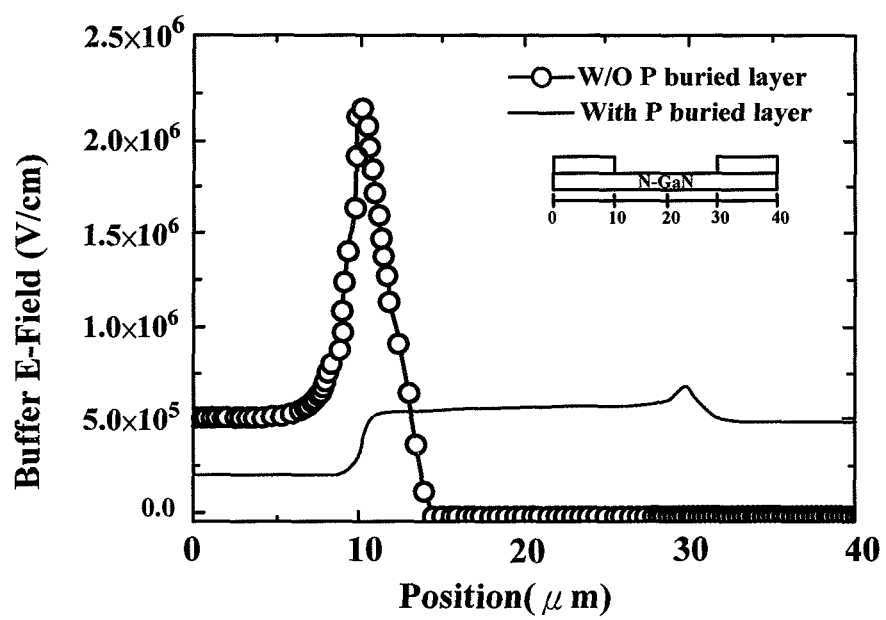

Refer to FIG. 3A and FIG. 3B diagrams respectively showing the distributions of the surface electric fields of the conventional Schottky diode and the Schottky diode of the present invention along Line R-R' and Line J-J' in FIG. 1 and FIG. 2 under a condition that a 600V reverse bias is applied to the Schottky diodes. From FIG. 3A, it is known that the surface electric field of the conventional Schottky diode has a peak strength over $5\times10^6$ V/cm at the interface of the Schottky electrode 6 and the protection layer 7, and that the strength of the surface electric field of the conventional Schottky diode decreases rapidly along the horizontal directions far away from the position of the peak strength. From FIG. 3A, it is also known that the Schottky diode structure of the present invention has a surface electric field uniformly distributed horizontally. From FIG. 3A and FIG. 3B, it is known that the electric field of the conventional Schottky diode does not descend obviously in the vertical direction. In the conventional Schottky diode, the peak strength of the electric field only decreases slightly from $5\times10^6$ V/cm at the N-type gallium nitride layer 4 to $2\times10^6$ V/cm at the buffer layer 3. Such a peak strength is sufficient to break down the silicon substrate. From FIG. 3B, it is known that the electric field of the Schottky diode of the present invention is also uniformly distributed in the vertical direction. Therefore, the present invention can effectively increase the breakdown voltage of the entire element.

Figure 4:
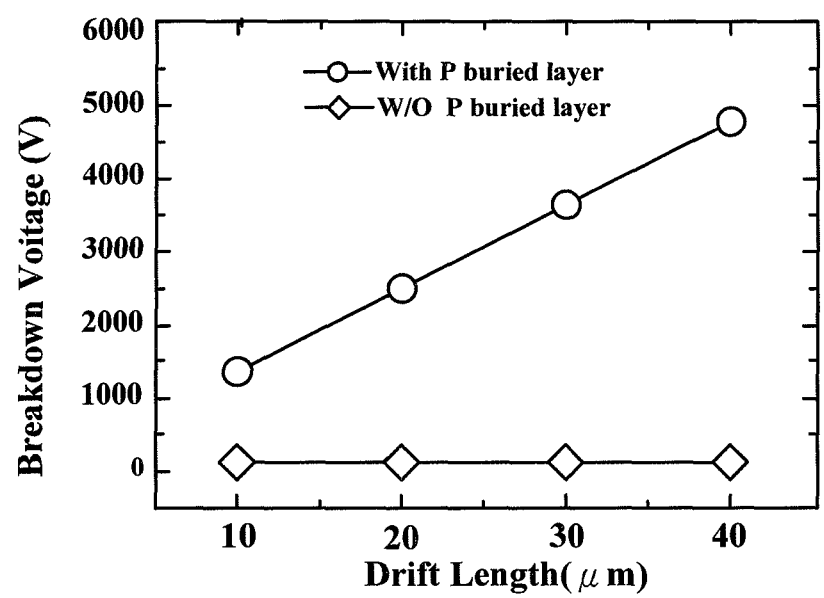
FIG. 4 is a diagram schematically showing the simulation result of the relationship between the drift length and the breakdown voltage.

Refer to FIG. 4. In one embodiment, the length $L_{drift}$ of the drift region between the Schottky electrode 14 and the ohmic contact electrode 15 is increased to make the distribution of the electric field more uniformly so as to increase the breakdown voltage of the entire element.

The present invention also proposes a method for fabricating the abovementioned Schottky diode structure, which comprises steps:

(a) preparing the substrate 11;

(b) forming the P-type gallium nitride layer 12 on the substrate 11;

(c) forming the N-type gallium nitride layer 13 on the P-type gallium nitride layer 12; and (d) forming the Schottky electrode 14 on the N-type gallium nitride 13.

The abovementioned steps are further described in detail below.

Firstly, prepare the substrate 11. The material of the substrate 11 has been described hereinbefore and will not repeat herein. Next, form the P-type gallium nitride layer 12 over the substrate 11 with a method conventionally used in the field, such as a chemical vapor deposition (CVD) method or a molecular beam epitaxy (MBE) method. Before the P-type gallium nitride layer 12 is formed over the substrate 11 may be added Step (a-1): forming the buffer layer 16 on the substrate 11. The buffer layer 16 may be a single-layer or multi-layer structure and can increase the stability of the structure between the substrate 11 and the P-type gallium nitride layer 12. The material of the buffer layer 16 has been described hereinbefore and will not repeat herein. Next, form the N-type gallium nitride layer 13 on the P-type gallium nitride layer 12. The present invention does not require that the N-type gallium nitride layer 13 should be fabricated with a special method. The N-type gallium nitride layer 13 may be fabricated with a chemical vapor deposition (CVD) method or a molecular beam epitaxy (MBE) method.

After Step (d), the method of the present invention may further comprises Step (e): forming the ohmic contact electrode 15 on the N-type gallium nitride 13. Moreover, before the ohmic contact electrode 15 is formed on the N-type gallium nitride 13, the $N^+$-type gallium nitride layer 18 may be formed to function as the field stop layer to decrease the contact resistance of the ohmic contact electrode 15 and increase the on-state current.

In summary, the present invention proposes a Schottky diode structure and a method for fabricating the same, which can effectively average the electric field distribution, lower the peak strength of the electric field and raise the breakdown voltage. The present invention further increases the length of the drift region between the Schottky electrode and the ohmic contact electrode to effectively decrease the surface electric field and raise the breakdown voltage. Thereby is increased the range of operating voltage of the entire element.

The embodiments described above are only to exemplify the present invention but not to limit the scope of the present invention. Any equivalent modification or variation according to the technical contents and the drawings disclosed in the specification is to be also included within the scope of the present invention.

What is claimed is:

1. A Schottky diode structure comprising
a substrate;
a P-type gallium nitride layer formed on the substrate;
an N-type gallium nitride layer formed on the P-type gallium nitride layer; and
a Schottky electrode formed on the N-type gallium nitride layer;
wherein an interface between the P-type gallium nitride layer and the N-type gallium nitride layer forms a PN junction parallel to a surface of the substrate such that a surface electric field of the Schottky electrode is uniformly distributed horizontally.

2. The Schottky diode structure according to claim 1, wherein the charges of the P-type gallium nitride layer and the N-type gallium nitride layer are in equilibrium.

3. The Schottky diode structure according to claim 1, wherein each of the P-type gallium nitride layer and the N-type gallium nitride layer has a dopant concentration of $10^{15}$-$10^{18}$cm$^{-3}$.

4. The Schottky diode structure according to claim 1, wherein the thicknesses and the dopant concentrations of the P-type gallium nitride layer and the N-type gallium nitride layer are substantially identical.

5. The Schottky diode structure according to claim 1, wherein the substrate is a silicon substrate.

6. The Schottky diode structure according to claim 1 further comprising a buffer layer formed between the substrate and the P-type gallium nitride layer, wherein the buffer layer is a single-layer or a multi-layer structure.

7. The Schottky diode structure according to claim 6, wherein the buffer layer is made of a material selected from a group consisting of silicon nitride, aluminum nitride, high temperature aluminum nitride, aluminum gallium nitride, indium gallium nitride, silicon carbon nitride, low temperature gallium nitride, and gallium nitride.

8. The Schottky diode structure according to claim 1 further comprising an ohmic contact electrode formed on the N-type gallium nitride layer.

9. The Schottky diode structure according to claim 8 further comprising an $N^+$-type gallium nitride layer formed between the ohmic contact electrode and the N-type gallium nitride layer.

10. The Schottky diode structure according to claim 9, wherein the $N^+$-type gallium nitride layer has a dopant concentration of over $10^{18}$cm$^{-3}$.

11. The Schottky diode structure according to claim 8, wherein the ohmic contact electrode is made of a material selected from a group consisting of nickel, platinum and palladium.

12. A method for fabricating a Schottky diode, comprising steps:
preparing a substrate;
forming a P-type gallium nitride layer on the substrate;
forming an N-type gallium nitride layer on the P-type gallium nitride layer; and
forming a Schottky electrode on the N-type gallium nitride;
wherein a interface between the P-type gallium nitride layer and the N-type gallium nitride layer forms a PN junction parallel to a surface of the substrate such that a surface electric field of the Schottky electrode is uniformly distributed horizontally.

13. The method for fabricating a Schottky diode according to claim 12 further comprising a step of forming a buffer layer on the substrate before forming the P-type gallium nitride layer on the substrate.

14. The method for fabricating a Schottky diode according to claim 12, wherein said P-type gallium nitride layer and said N-type gallium nitride layer share a common boundary.

15. The Schottky diode structure according to claim 1, wherein said P-type gallium nitride layer and said N-type gallium nitride layer share a common boundary.

* * * * *